US010833185B2

(12) United States Patent
Liao et al.

(10) Patent No.: US 10,833,185 B2
(45) Date of Patent: Nov. 10, 2020

(54) HETEROJUNCTION SEMICONDUCTOR DEVICE HAVING SOURCE AND DRAIN PADS WITH IMPROVED CURRENT CROWDING (71) Applicant: DELTA ELECTRONICS, INC., Taoyuan (TW)

(72) Inventors: Wen-Chia Liao, Taoyuan (TW); Ying-Chen Liu, Taoyuan (TW); Chen-Ting Chiang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 86 days.

(21) Appl. No.: 15/678,102

(22) Filed: Aug. 15, 2017

(65) Prior Publication Data

US 2018/0026125 A1 Jan. 25, 2018

Related U.S. Application Data (63) Continuation-in-part of application No. 15/297,123, filed on Oct. 18, 2016, now Pat. No. 10,084,076, (Continued)

(30) Foreign Application Priority Data

Sep. 10, 2013 (TW) .............................. 102132512 A
Feb. 27, 2014 (TW) .............................. 103106659 A
Apr. 21, 2014 (TW) .............................. 103114340 A (51) Int. Cl.
*H01L 29/778* (2006.01)
*H01L 23/495* (2006.01)
(Continued)

(52) U.S. Cl.
CPC ...... *H01L 29/7787* (2013.01); *H01L 23/3114* (2013.01); *H01L 23/3171* (2013.01);
(Continued)

(58) Field of Classification Search
None
See application file for complete search history.

(56) References Cited

U.S. PATENT DOCUMENTS 5,767,546 A * 6/1998 Williams ............ H01L 23/4824
257/343
7,072,161 B2 7/2006 Chen
(Continued)

FOREIGN PATENT DOCUMENTS

CN 1321340 A 11/2001
CN 1973377 A 5/2007
(Continued)

*Primary Examiner* — Matthew E. Gordon
(74) *Attorney, Agent, or Firm* — CKC & Partners Co., LLC (57) ABSTRACT A semiconductor device includes an active layer, a source electrode, a drain electrode, a gate electrode, a source pad, a drain pad, and a source external connecting element. The source electrode, the drain electrode, and the gate electrode are disposed on an active region of the active layer. The source pad is electrically connected to the source electrode and includes a body portion, a plurality of branch portions, and a current diffusion portion. The body portion is at least partially disposed on the active region of the active layer. The current diffusion portion interconnects the body portion and the branch portions. A width of the current diffusion portion is greater than a width of the branch portion and less than a half of a width of the body portion. The source external connecting element is disposed on the body portion and spaced from the current diffusion portion.

20 Claims, 6 Drawing Sheets

Related U.S. Application Data which is a continuation of application No. 14/496,471, filed on Sep. 25, 2014, now Pat. No. 9,508,843, which is a continuation-in-part of application No. 14/185,322, filed on Feb. 20, 2014, now Pat. No. 8,957,493.

(51) Int. Cl.

| | | |
|---|---|---|
| *H01L 29/20* | (2006.01) | |
| *H01L 29/417* | (2006.01) | |
| *H01L 29/205* | (2006.01) | |
| *H01L 29/40* | (2006.01) | |
| *H01L 23/00* | (2006.01) | |
| *H01L 23/31* | (2006.01) | |
| *H01L 23/535* | (2006.01) | |
| *H01L 23/528* | (2006.01) | |
| *H01L 29/423* | (2006.01) | |
| *H01L 23/522* | (2006.01) | |
| *H01L 29/10* | (2006.01) | |

(52) U.S. Cl.
CPC .. *H01L 23/49537* (2013.01); *H01L 23/49541* (2013.01); *H01L 23/49562* (2013.01); *H01L 23/49575* (2013.01); *H01L 23/528* (2013.01); *H01L 23/5226* (2013.01); *H01L 23/5283* (2013.01); *H01L 23/535* (2013.01); *H01L 24/06* (2013.01); *H01L 29/2003* (2013.01); *H01L 29/205* (2013.01); *H01L 29/402* (2013.01); *H01L 29/41758* (2013.01); *H01L 29/4236* (2013.01); *H01L 29/7786* (2013.01); H01L 24/48 (2013.01); H01L 24/49 (2013.01); H01L 29/1066 (2013.01); H01L 29/42376 (2013.01); H01L 2224/0401 (2013.01); H01L 2224/04042 (2013.01); H01L 2224/05093 (2013.01); H01L 2224/0603 (2013.01); H01L 2224/45014 (2013.01); H01L 2224/48137 (2013.01); H01L 2224/48247 (2013.01); H01L 2224/48257 (2013.01); H01L 2224/49111 (2013.01); H01L 2924/00 (2013.01); H01L 2924/00014 (2013.01); H01L 2924/1033 (2013.01); H01L 2924/10344 (2013.01); H01L 2924/1304 (2013.01); H01L 2924/13064 (2013.01)

(56) References Cited

U.S. PATENT DOCUMENTS

| | | |
|---|---|---|
| 7,800,131 B2 | 9/2010 | Miyamoto et al. |
| 7,928,475 B2 | 4/2011 | Parikh et al. |
| 8,237,196 B2 | 8/2012 | Saito |
| 8,530,978 B1 | 9/2013 | Chu et al. |
| 8,691,684 B2 | 4/2014 | Zhong et al. |
| 9,508,843 B2 | 11/2016 | Lin et al. |
| 10,236,236 B2 | 3/2019 | Lin et al. |
| 2003/0076639 A1 | 4/2003 | Chen |
| 2003/0082860 A1 | 5/2003 | Yoshida |
| 2005/0189562 A1 | 9/2005 | Kinzer |
| 2007/0007545 A1* | 1/2007 | Salcedo .............. H01L 27/0262 257/127 |
| 2007/0108617 A1* | 5/2007 | Heiling ............... H01L 23/4824 257/758 |
| 2007/0205506 A1 | 9/2007 | Dragon et al. |
| 2008/0272443 A1 | 11/2008 | Hoshi et al. |
| 2008/0303097 A1 | 12/2008 | Alter et al. |
| 2009/0108459 A1 | 4/2009 | Motoyui |
| 2011/0193171 A1 | 8/2011 | Yamagiwa et al. |
| 2011/0248283 A1 | 10/2011 | Cao et al. |
| 2013/0062625 A1 | 3/2013 | Takada et al. |
| 2013/0146946 A1 | 6/2013 | Tsurumi et al. |
| 2013/0161692 A1 | 6/2013 | Koudymov |
| 2013/0221437 A1 | 8/2013 | Illegems et al. |
| 2014/0001515 A1 | 1/2014 | Kudymov et al. |
| 2015/0295573 A1 | 10/2015 | Suzuki et al. |
| 2015/0340344 A1 | 11/2015 | Lin et al. |
| 2016/0043643 A1 | 2/2016 | Ujita et al. |
| 2016/0329890 A1 | 11/2016 | Ujita et al. |
| 2017/0154839 A1 | 6/2017 | Lin et al. |

FOREIGN PATENT DOCUMENTS

| | | |
|---|---|---|
| CN | 102544002 A | 7/2012 |
| CN | 103178106 A | 6/2013 |
| TW | 200633211 | 9/2006 |
| TW | 201036156 A | 10/2010 |
| TW | 201338113 A | 9/2013 |
| TW | 201340316 A | 10/2013 |
| TW | 201511267 A | 3/2015 |
| TW | 201533906 A | 9/2015 |

\* cited by examiner

HETEROJUNCTION SEMICONDUCTOR DEVICE HAVING SOURCE AND DRAIN PADS WITH IMPROVED CURRENT CROWDING

CROSS-REFERENCE TO RELATED APPLICATIONS

The present application is a continuation-in-part application of U.S. application Ser. No. 15/297,123, filed Oct. 18, 2016, which is a continuation application of U.S. application Ser. No. 14/496,471, filed Sep. 25, 2014, which claims priority to Taiwan Application Serial Number 103106659, filed Feb. 27, 2014 and Taiwan Application Serial Number 103114340, filed Apr. 21, 2014, which are herein incorporated by reference in their entireties. U.S. application Ser. No. 14/496,471 is a continuation-in-part application of U.S. application Ser. No. 14/185,322, filed Feb. 20, 2014 which claims priority to Taiwan Application Serial Number 102132512, filed Sep. 10, 2013, which are herein incorporated by reference in their entireties.

BACKGROUND

Field of Disclosure

The present disclosure relates to a semiconductor device.

Description of Related Art

A nitride semiconductor has high electric breakdown field and high electron saturation velocity. Thus, the nitride semiconductor is expected to be a semiconductor material for semiconductor devices having high breakdown voltage and low on-state resistance. Many of the conventional semiconductor devices using the nitride related materials may have heterojunctions. The heterojunction is configured with two types of nitride semiconductors having different bandgap energies from each other and is able to generate a two-dimensional electron gas layer (2DEG layer) near the junction plane. The semiconductor devices having the heterojunction may achieve a low on-state resistance. These types of semiconductor devices are called high electron mobility transistors (HEMT).

SUMMARY

A semiconductor device includes an active layer, a source electrode, a drain electrode, a gate electrode, a source pad, a drain pad, and at least one source external connecting element. The active layer has an active region. The source electrode, the drain electrode, and the gate electrode are disposed on the active region of the active layer. The source pad is electrically connected to the source electrode. The source pad includes a body portion, a plurality of branch portions, and at least one current diffusion portion. The body portion of the source pad is at least partially disposed on the active region of the active layer. The body portion of the source pad extends along a first direction. The branch portions of the source pad extend along a second direction different from the first direction. The current diffusion portion of the source pad interconnects the body portion of the source pad and the branch portions of the source pad and extends along the first direction. A width of the current diffusion portion of the source pad is greater than a width of one of the branch portions of the source pad and less than a half of a width of the body portion of the source pad. The drain pad is electrically connected to the drain electrode. The source external connecting element is disposed on the body portion of the source pad and spaced from the current diffusion portion of the source pad.

In some embodiments, the current diffusion portion of the source pad separates the body portion of the source pad and the branch portions of the source pad.

In some embodiments, the body portion of the source pad and the branch portions of the source pad are disposed on opposite sides of the current diffusion portion of the source pad.

In some embodiments, an edge of the source external connecting element adjacent to the current diffusion portion of the source pad is aligned with an interface of the body portion of the source pad and the current diffusion portion of the source pad.

In some embodiments, the current diffusion portion of the source pad and the body portion of the source pad have substantially the same length.

In some embodiments, the source pad satisfies: $1 \leq L2/((W1+W3)/2) \leq 3$, wherein W1 is the width of the current diffusion portion of the source pad, W3 is the width of the body portion of the source pad, and L2 is a length of one of the branch portions of the source pad.

In some embodiments, the body portion of the source pad overlaps at least a portion of the source electrode.

In some embodiments, the semiconductor device further includes at least one bottom source metal layer disposed between the source electrode and the source pad.

In some embodiments, a plurality of the bottom source metal layers are spaced from each other.

In some embodiments, the semiconductor device further includes at least one top source metal layer disposed between the bottom source metal layer and the source pad.

In some embodiments, a plurality of the top source metal layers are spaced from each other.

In some embodiments, a thickness of the bottom source metal layer is smaller than a sum of a thickness of the top source metal layer and a thickness of the source pad.

In some embodiments, the top source metal layer is wider than at least one of the branch portions of the source pad.

In some embodiments, the drain pad includes a body portion, a plurality of branch portions, and a current diffusion portion. The body portion of the drain pad is at least partially disposed on the active region of the active layer. The body portion of the drain pad extends along the first direction. The branch portions of the drain pad extend along the second direction, and the branch portions of the source pad and the branch portions of the drain pad are alternately arranged. The current diffusion portion of the drain pad interconnects the body portion of the drain pad and the branch portions of the drain pad and extends along the first direction.

In some embodiments, a width of the current diffusion portion of the drain pad is greater than a width of one of the branch portions of the drain pad and less than a half of a width of the body portion of the drain pad.

In some embodiments, the semiconductor device further includes at least one bottom drain metal layer disposed between the drain electrode and the drain pad.

In some embodiments, a plurality of the bottom drain metal layers are spaced from each other.

In some embodiments, the semiconductor device further includes at least one top drain metal layer disposed between the bottom drain metal layer and the drain pad.

In some embodiments, a plurality of the top drain metal layers are spaced from each other.

In some embodiments, the current diffusion portion of the source pad and the current diffusion portion of the drain pad define an accommodating area therebetween, and a density of the branch portions of the source pad and the branch portions of the drain pad in the accommodating area is about 50% to about 90%.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
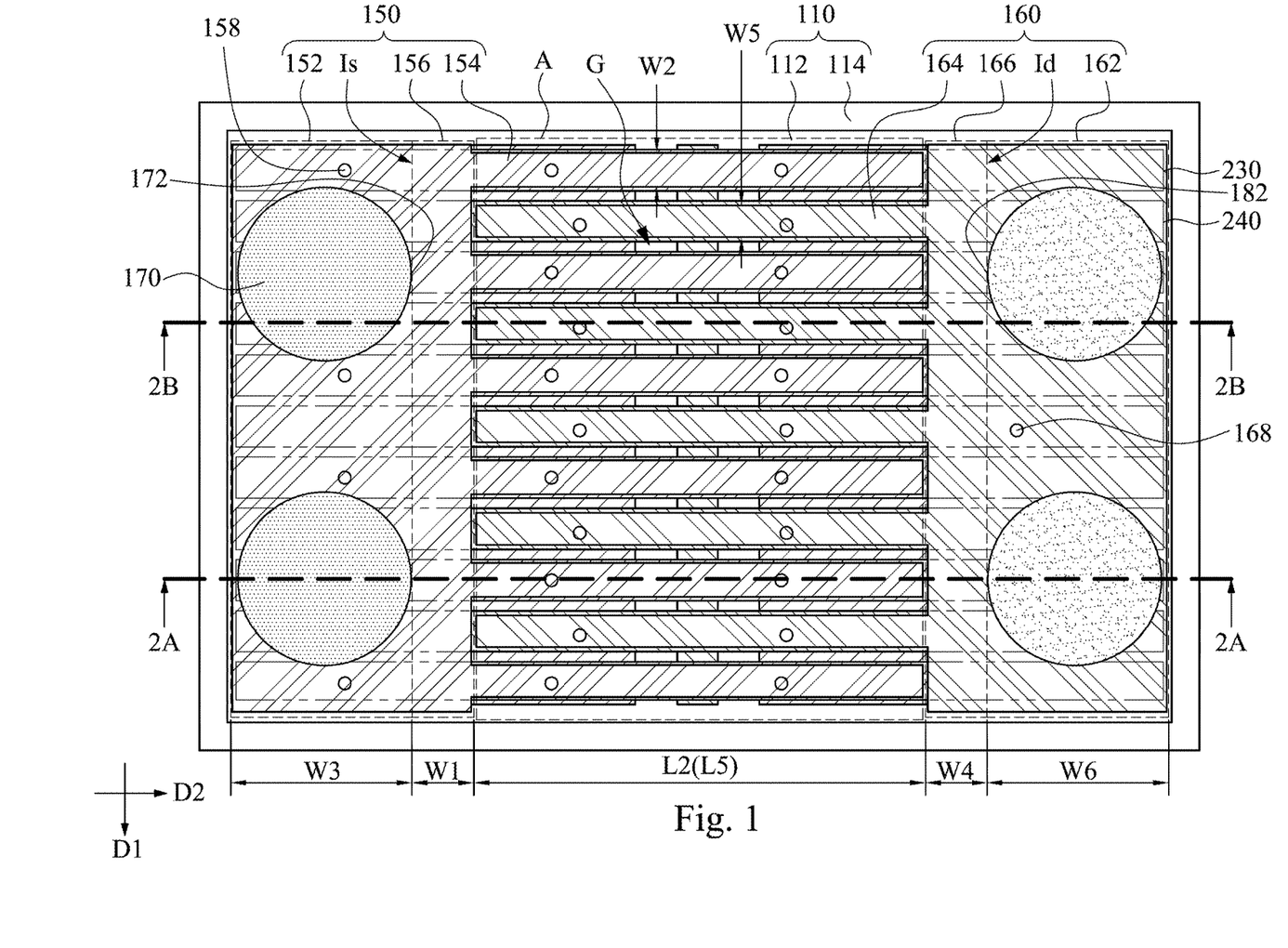
FIG. 1 is a top view of a semiconductor device according to some embodiments of the present disclosure.
Figure 2A:
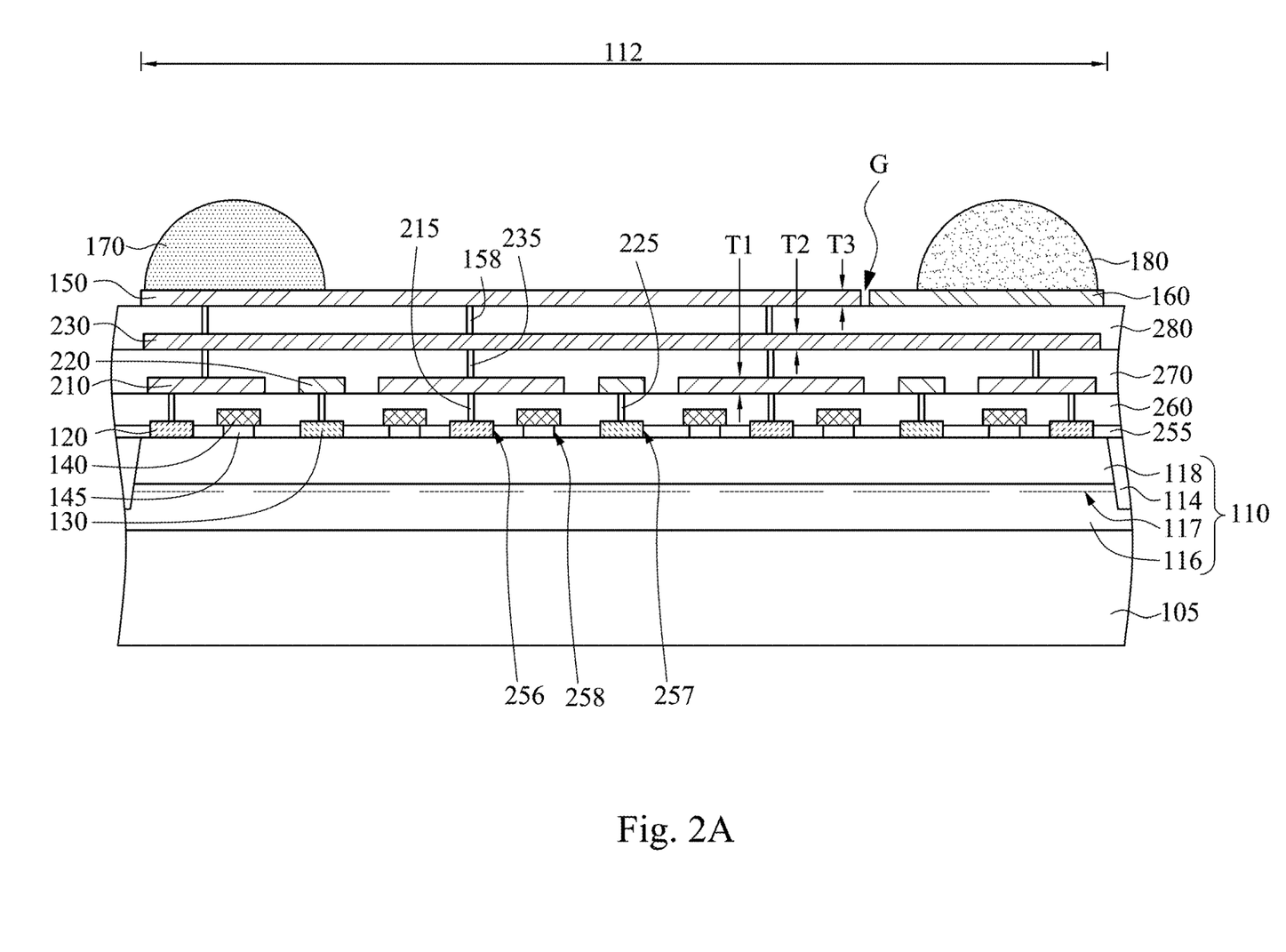
FIG. 2A is a cross-sectional view along line 2A-2A of FIG. 1.
Figure 2B:
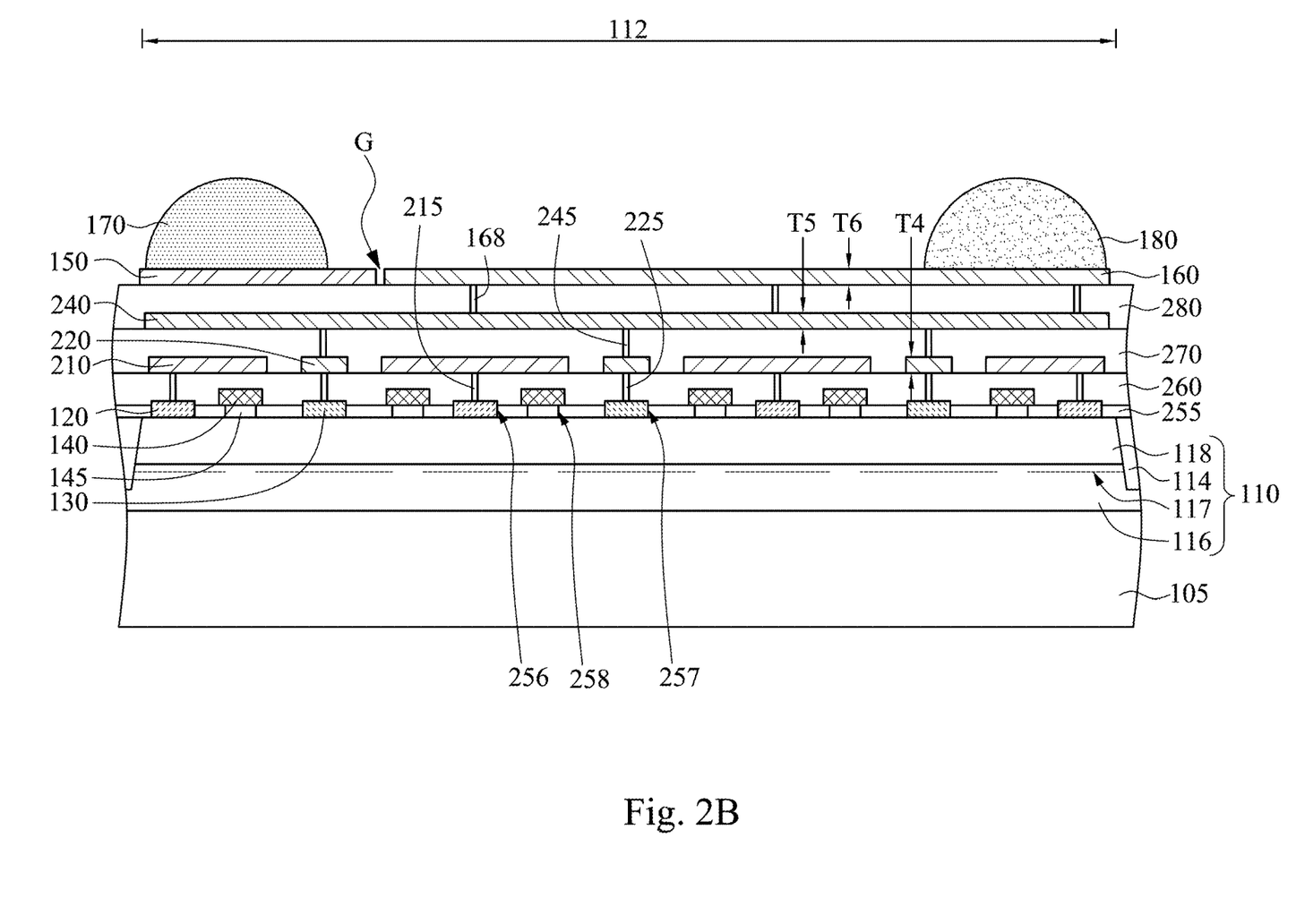
FIG. 2B is a cross-sectional view along line 2B-2B of FIG. 1.

FIG. 1 is a top view of a semiconductor device according to some embodiments of the present disclosure, FIG. 2A is a cross-sectional view along line 2A-2A of FIG. 1, and FIG. 2B is a cross-sectional view along line 2B-2B of FIG. 1. Reference is made to FIGS. 1, 2A, and 2B. The semiconductor device includes an active layer 110, a source electrode 120, a drain electrode 130, a gate electrode 140, a source pad 150, a drain pad 160, and at least one source external connecting element 170. The active layer 110 has an active region 112. The source electrode 120, the drain electrode 130, and the gate electrode 140 are disposed on the active region 112 of the active layer 110. The source pad 150 is electrically connected to the source electrode 120, and the source pad 150 includes a body portion 152, a plurality of branch portions 154, and a current diffusion portion 156. The body portion 152 is at least partially disposed on the active region 112 of the active layer 110. For example, a projection of the body portion 152 on the active layer 112 is within the active region 112 or overlaps the active region 112. That is, the body portion 152 overlaps at least a portion of the source electrodes 120, at least a portion of the drain electrodes 130, and/or at least a portion of the gate electrodes 140. The body portion 152 extends along a first direction D1. The branch portions 154 extend along a second direction D2 different from the first direction D1. For example, the first direction D1 is substantially perpendicular to the second direction D2 as shown in FIG. 1. The current diffusion portion 156 interconnects the body portion 152 and the branch portions 154 and extends along the first direction D1. A width W1 of the current diffusion portion 156 is greater than a width W2 of one of the branch portions 154 and less than a half of a width W3 of the body portion 152. The source external connecting element 170 is disposed on and in contact with the body portion 152 and spaced from the current diffusion portion 156. That is, the source external connecting element 170 is not in contact with the current diffusion portion 156. The term "substantially" as used herein may be applied to modify any quantitative representation which could permissibly vary without resulting in a change in the basic function to which it is related.

Moreover, the drain pad 160 is electrically connected to the drain electrode 130, and the drain pad 160 includes a body portion 162, a plurality of branch portions 164, and a current diffusion portion 166. The body portion 162 is at least partially disposed on the active region 112 of the active layer 110. For example, a projection of the body portion 162 on the active layer 112 is within the active region 112 or overlaps the active region 112. That is, the body portion 162 overlaps at least a portion of the source electrodes 120, at least a portion of the drain electrodes 130, and/or at least a portion of the gate electrodes 140. The body portion 162 extends along the first direction D1. That is, the body portions 152 and 162 are substantially parallel to each other. The branch portions 164 extend along the second direction D2. That is, the branch portions 154 and 164 are substantially parallel to each other. The branch portions 154 and 164 are alternately arranged along the first direction D1. The current diffusion portion 166 interconnects the body portion 162 and the branch portions 164 and extends along the first direction D1. A width W4 of the current diffusion portion 166 is greater than a width W5 of one of the branch portions 164 and less than a half of a width W6 of the body portion 162.

In this embodiment, the current diffusion portion 156 can improve the current crowding problem of the source pad 150. Specifically, the current flow from the source external connecting element 170 to the source electrodes 120 through the source pad 150. The current sequentially passes through the body portion 152, the current diffusion portion 156, and the branch portions 154 and to the source electrode. If the source external connecting element 170 is too close to the branch portions 154, i.e., the width W1 of the current diffusion portion 156 is too small, the current crowding will occur and worse the performance of the semiconductor device. In the source external connecting element 170 is too far from the branch portions 154, i.e., the width W1 of the current diffusion portion 156 is too large, the layout area of the semiconductor device is increased. Therefore, when the width W1 of the current diffusion portion 156 is greater than the width W2 of one of the branch portions 154 and less than a half of the width W3 of the body portion 152, the current crowding and the layout area of the semiconductor device can both be improved. Similarly, when the width W4 of the current diffusion portion 166 is greater than the width W5 of one of the branch portions 164 and less than a half of the width W6 of the body portion 162, the current crowding and the layout area of the semiconductor device can both be improved.

In FIG. 1, for the source pad 150, the current diffusion portion 156 separates the body portion 152 and the branch portions 154. In other words, the current diffusion portion 156 is disposed between the body portion 152 and the branch portions 154. Or, the body portion 152 and the branch portions 154 are disposed on opposite sides of the current diffusion portion 156. In some embodiments, the source pad 150 is integrally formed. That is, the body portion 152, the branch portions 154, and the current diffusion portion 156 are integrally formed. The branch portions 154 protrude from the current diffusion portion 156, such that the source pad 150 is finger-shaped. Furthermore, in FIG. 1, the current diffusion portion 156 and the body portion 152 have substantially the same length.

Moreover, for the drain pad 160, the current diffusion portion 166 separates the body portion 162 and the branch portions 164. In other words, the current diffusion portion 166 is disposed between the body portion 162 and the branch portions 164. Or, the body portion 162 and the branch portions 164 are disposed on opposite sides of the current diffusion portion 166. In some embodiments, the drain pad 160 is integrally formed. That is, the body portion 162, the branch portions 164, and the current diffusion portion 166 are integrally formed. The branch portions 166 protrude from the current diffusion portion 166, such that the source pad 160 is finger-shaped. Furthermore, in FIG. 1, the current diffusion portion 166 and the body portion 162 have substantially the same length.

An edge 172 of the source external connecting element 170 adjacent to the current diffusion portion 156 is aligned with an interface Is of the body portion 152 and the current diffusion portion 156. In some embodiments, the source external connecting element 170 can be a bump or a wire to interconnect the source pad 150 to an external element or circuit.

In some embodiments, the source pad 150 satisfies: $1 \leq L2/((W1+W3)/2) \leq 3$, where L2 is the length of the branch portion 154. The sum of the width W1 of the current diffusion portion 156 and the width W3 of the body portion 152 is related to the current crowding effect at the joint of the current diffusion portion and the branch portions of the source. In some embodiments, the current density at the joint is reduced when the sum of the widths W1 and W3 is increased. Furthermore, the length L2 of the branch portion 154 is related to the total resistance of the source. In some embodiments, the total resistance of the source is increased when the length L2 is increased. As such, when the source pad 150 satisfies the aforementioned equation, the current crowding effect and the total resistance of the source can be both improved.

Similarly, in some embodiments, the drain pad 160 satisfies: $1 \leq L5/((W4+W6)/2) \leq 3$, where L5 is the length of the branch portion 164. The sum of the width W4 of the current diffusion portion 166 and the width W6 of the body portion 162 is related to the current crowding effect at the joint of the current diffusion portion and the branch portions of the drain. In some embodiments, the current density at the joint is reduced when the sum of the widths W4 and W6 is increased. Furthermore, the length L5 of the branch portion 164 is related to the total resistance of the drain. In some embodiments, the total resistance of the drain is increased when the length L5 is increased. As such, when the drain pad 160 satisfies the aforementioned equation, the current crowding effect and the total resistance of the drain can be both improved.

In FIG. 1, the semiconductor device further includes at least one drain external connecting element 180 disposed on and in contact with the body portion 162 and spaced from the current diffusion portion 166. That is, the drain external connecting element 180 is not in contact with the current diffusion portion 166. An edge 182 of the source external connecting element 180 adjacent to the current diffusion portion 166 is aligned with an interface Id of the body portion 162 and the current diffusion portion 166. In some embodiments, the drain external connecting element 180 can be a bump or a wire to interconnect the drain pad 160 to an external element or circuit. In some embodiments, the source external connecting element 170 and the drain external connecting element 180 can have the same type of connecting element (bumps or wires). Alternatively, the source external connecting element 170 and the drain external connecting element 180 can have different types of connecting elements. For example, the source external connecting element 170 is a bump and the drain external connecting element 180 is a wire, or vise versa.

Reference is made to FIGS. 2A and 2B. In some embodiments, the active layer 110 includes a channel layer 116 and a barrier layer 118 disposed on the channel layer 116. A two-dimensional electron gas (2DEG) channel 117 is formed between the channel layer 116 and the barrier layer 118 and in the active region 112. The barrier layer 118 may be a layer that induces the 2DEG channel 117 in the channel layer 116. The 2DEG channel 117 may be formed in a region of the channel layer 116 adjacent to an interface between the channel layer 116 and the barrier layer 118. In some embodiments, the channel layer 116 can be made of GaN, and the barrier layer 118 can be made of AlGaN. The active layer 110 further includes an insulating region 114 surrounding the active region 112. The insulating region 114 may be formed by implanting ions, such as oxygen, nitrogen, carbon, or the like, into the active layer 112. In some other embodiments, the insulating region 114 is a shallow trench isolation (STI). The active layer 110 may be selectively disposed on a substrate 105. The substrate 105 may be a silicon substrate or a sapphire substrate, but the claimed scope of the present invention is not limited in this respect. In one embodiment, the semiconductor device may further include a buffer layer (not shown) disposed between the active layer 110 and the substrate 105.

Figure 3:
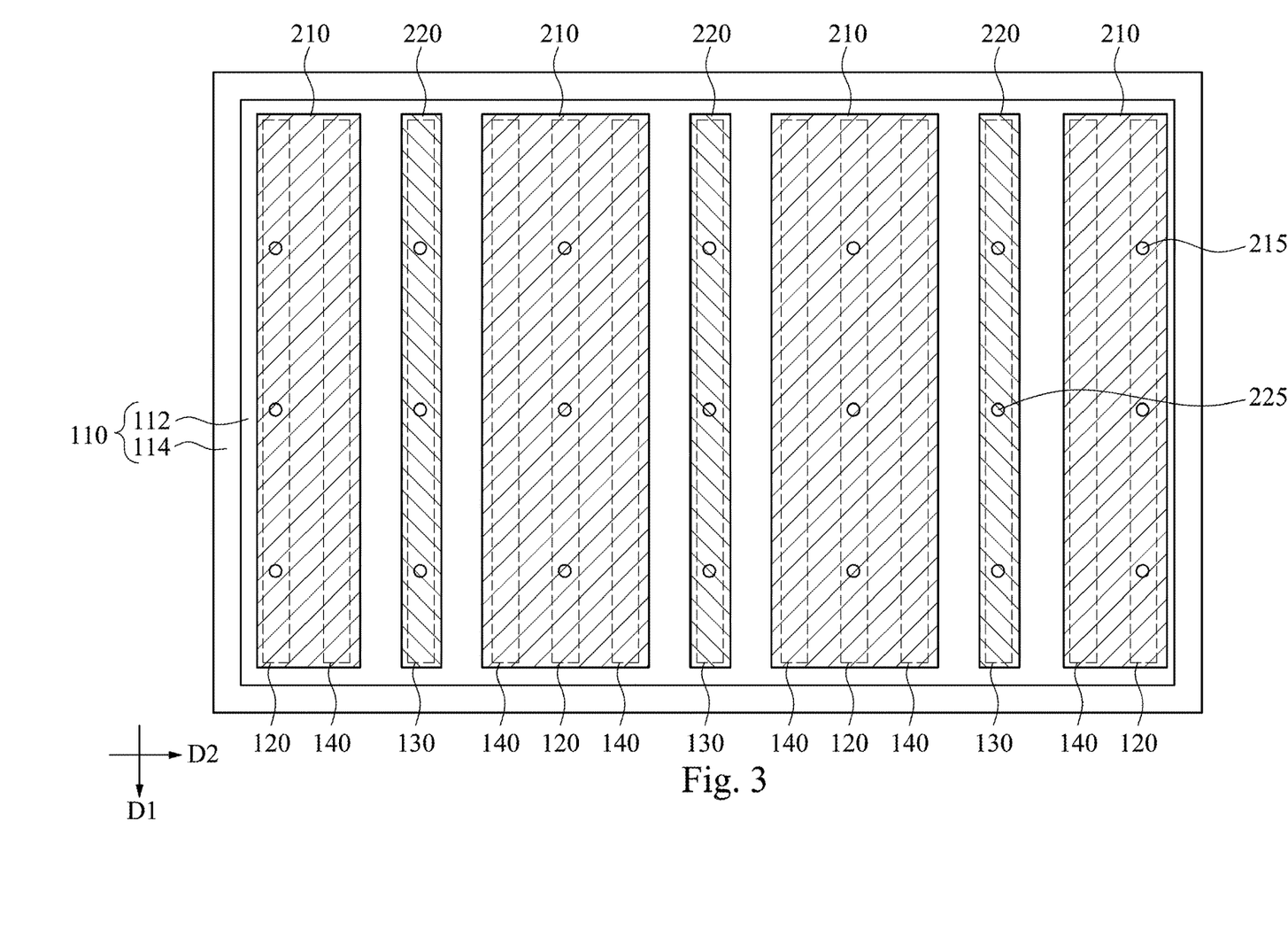
FIG. 3 is a top view of bottom source metal layers, bottom drain metal layers, the source electrodes, the drain electrodes, the gate electrodes, and the active layer of the semiconductor device of FIGS. 1 and 2A.

FIG. 3 is a top view of bottom source metal layers 210, bottom drain metal layers 220, the source electrodes 120, the drain electrodes 130, the gate electrodes 140, and the active layer 110 of the semiconductor device of FIGS. 1 and 2A. Reference is made to FIGS. 2A, 2B, and 3. The semiconductor device further includes p-type layers 145, dielectric layers 255 and 260, bottom source metal layers 210, and bottom drain metal layers 220. For clarity, the dielectric layers 255 and 260 are illustrated in FIGS. 2A and 2B and are omitted in FIG. 3. The p-type layers 145 are disposed between the gate electrodes 140 and the active layer 110. Therefore, the semiconductor device is an enhancement mode transistor. In some other embodiments, however, the semiconductor device can be a depletion mode transistor, and the present disclosure is not limited in this respect. The dielectric layer 255 is disposed on the active layer 110 and has a plurality of openings 256, 257, and 258. The source electrodes 120 are disposed in the openings 256, the drain electrodes 130 are disposed in the openings 257, and the p-type layers 145 are disposed in the openings 258.

The dielectric layer 260 is disposed on the dielectric layer 255 and covers the source electrodes 120, the drain electrodes 130, and the gate electrodes 140. In other words, the source electrodes 120, the drain electrodes 130, and the gate electrodes 140 are disposed between the dielectric layer 260 and the active layer 110. In some embodiments, the source electrodes 120 and the drain electrodes 130 are ohmic contacts. The bottom source metal layers 210 are disposed on the dielectric layer 260 and cover the source electrodes 120 and the gate electrodes 140, and the bottom drain metal layers 220 are disposed on the dielectric layer 260 and cover the drain electrodes 130. The bottom source metal layers 210 and the bottom drain metal layers 220 extend along the first direction D1 and alternately arranged along the second direction D2. The bottom source metal layers 210 are electrically connected to the source electrodes 120, for example, through vias 215 disposed in the dielectric layer 260 and are electrically isolated from the gate electrodes 140. The bottom drain metal layers 220 are electrically connected to the drain electrodes 130, for example, through vias 225 disposed in the dielectric layer 260. The bottom source metal layers 210 are spaced from each other, and the bottom drain metal layers 220 are spaced from each other.

Figure 4:
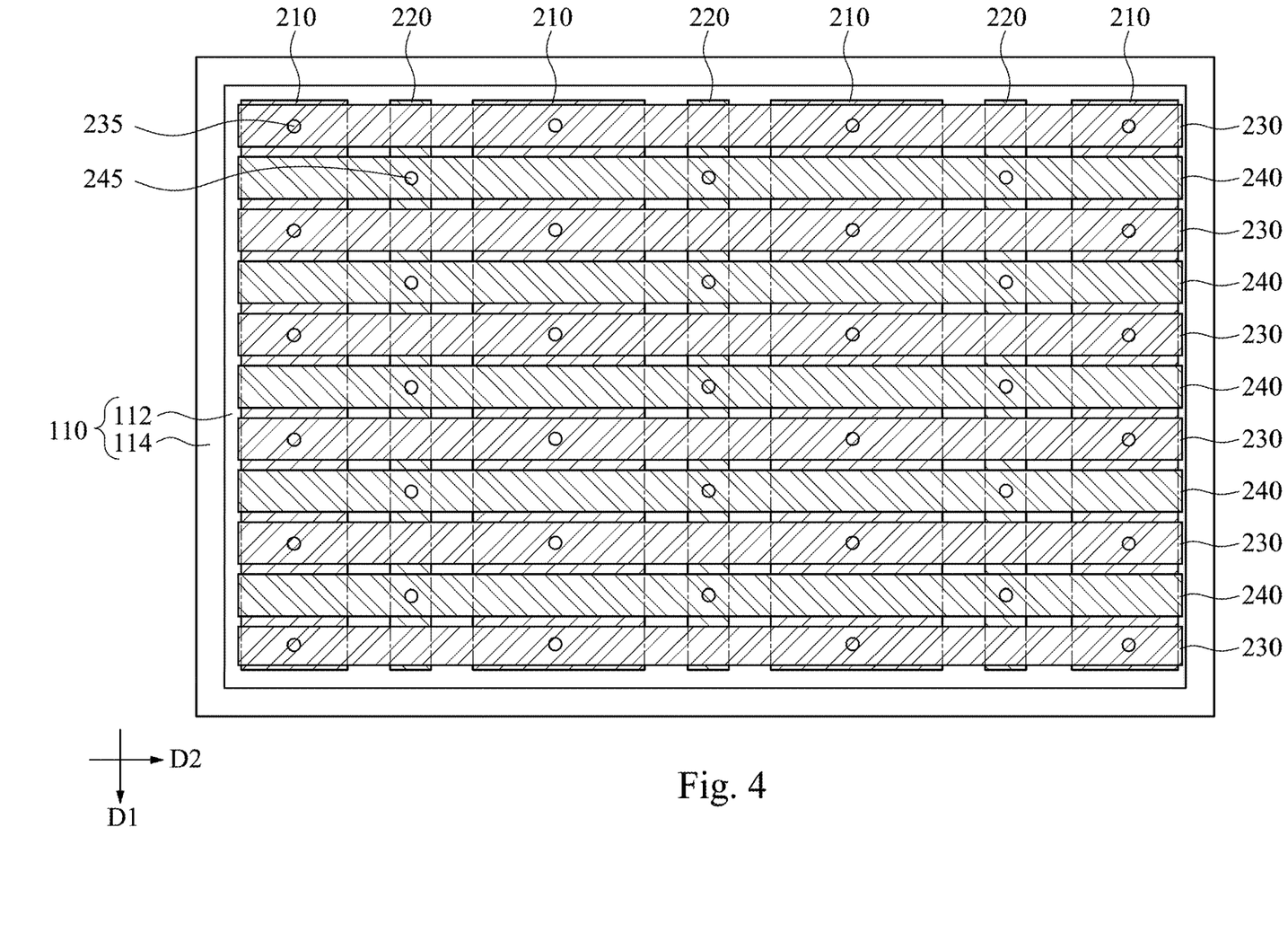
FIG. 4 is a top view of the bottom source metal layers, the bottom drain metal layers, top source metal layers, top drain metal layers, and the active layer of the semiconductor device of FIGS. 1 and 2A.

FIG. 4 is a top view of the bottom source metal layers 210, the bottom drain metal layers 220, top source metal layers 230, top drain metal layers 240, and the active layer 110 of the semiconductor device of FIGS. 1 and 2A. Reference is made to FIGS. 2A, 2B, and 4. The semiconductor device further includes a dielectric layer 270, top source metal layers 230, and top drain metal layers 240. For clarity, the dielectric layer 270 is illustrated in FIGS. 2A and 2B and is omitted in FIG. 4. The dielectric layer 270 covers the bottom source metal layers 210 and the bottom drain metal layers 220. In other words, the bottom source metal layers 210 and the bottom drain metal layers 220 are disposed between the dielectric layers 260 and 270. The top source metal layers 230 are disposed on the dielectric layer 270 and are electrically connected to the bottom source metal layers 210, for example, through vias 235 disposed in the dielectric layer 270. The top drain metal layers 240 are disposed on the dielectric layer 270 and are electrically connected to the bottom drain metal layers 220, for example, through vias 245 disposed in the dielectric layer 270. The top source metal layers 230 and the top drain metal layers 240 extend along the second direction D2 and alternately arranged along the first direction D1. That is, the top source metal layers 230 and the bottom source metal layers 210 extend along different directions, and the top drain metal layers 240 and the bottom drain metal layers 220 extend along different directions. The top source metal layers 230 are spaced from each other, and the top drain metal layers 240 are spaced from each other.

Reference is made to FIGS. 1, 2A, and 2B. The semiconductor device further includes a dielectric layer 280. For clarity, the dielectric layer 280 is illustrated in FIGS. 2A and 2B and is omitted in FIG. 1. The dielectric layer 280 covers the top source metal layers 230 and the top drain metal layers 240. That is, the top source metal layers 230 and the top drain metal layers 240 are disposed between the dielectric layers 270 and 280. The source pad 150 and the drain pad 160 are disposed on the dielectric layer 280. The source pad 150 is electrically connected to the top source metal layers 230, for example, through vias 158 disposed in the dielectric layer 280. The drain pad 160 is electrically connected to the top drain metal layers 240, for example, through vias 168 disposed in the dielectric layer 280.

Reference is made to FIGS. 2A and 2B. A thickness T1 of the bottom source metal layer 210 is smaller than a sum of a thickness T2 of the top source metal layer 230 and a thickness T3 of the source pad 150. With such configuration, the resistance of the source can be reduced. Similarly, a thickness T4 of the bottom drain metal layer 220 is smaller than a sum of a thickness T5 of the top drain metal layer 240 and a thickness T6 of the drain pad 160. With such configuration, the resistance of the drain can be reduced.

Reference is made to FIG. 1. The current diffusion portion 156 of the source pad 150 and the current diffusion portion 166 of the drain pad 160 define an accommodating area A therebetween. The (layout) density of the branch portions 154 of the source pad 150 and the branch portions 164 of the drain pad 160 in the accommodating area A is about 50% to about 90%. In another point of view, a gap G is formed between the source pad 150 and the drain pad 160. More specifically, the gap G is defined by the edges of the branch portions 154 of the source pad 150 and the edges of the branch portions 164 of the drain pad 160. An area of the gap G is about 10% to about 50% of the accommodating area A. With this configuration, the total resistance of the source and the drain can be further reduced.

Figure 5:
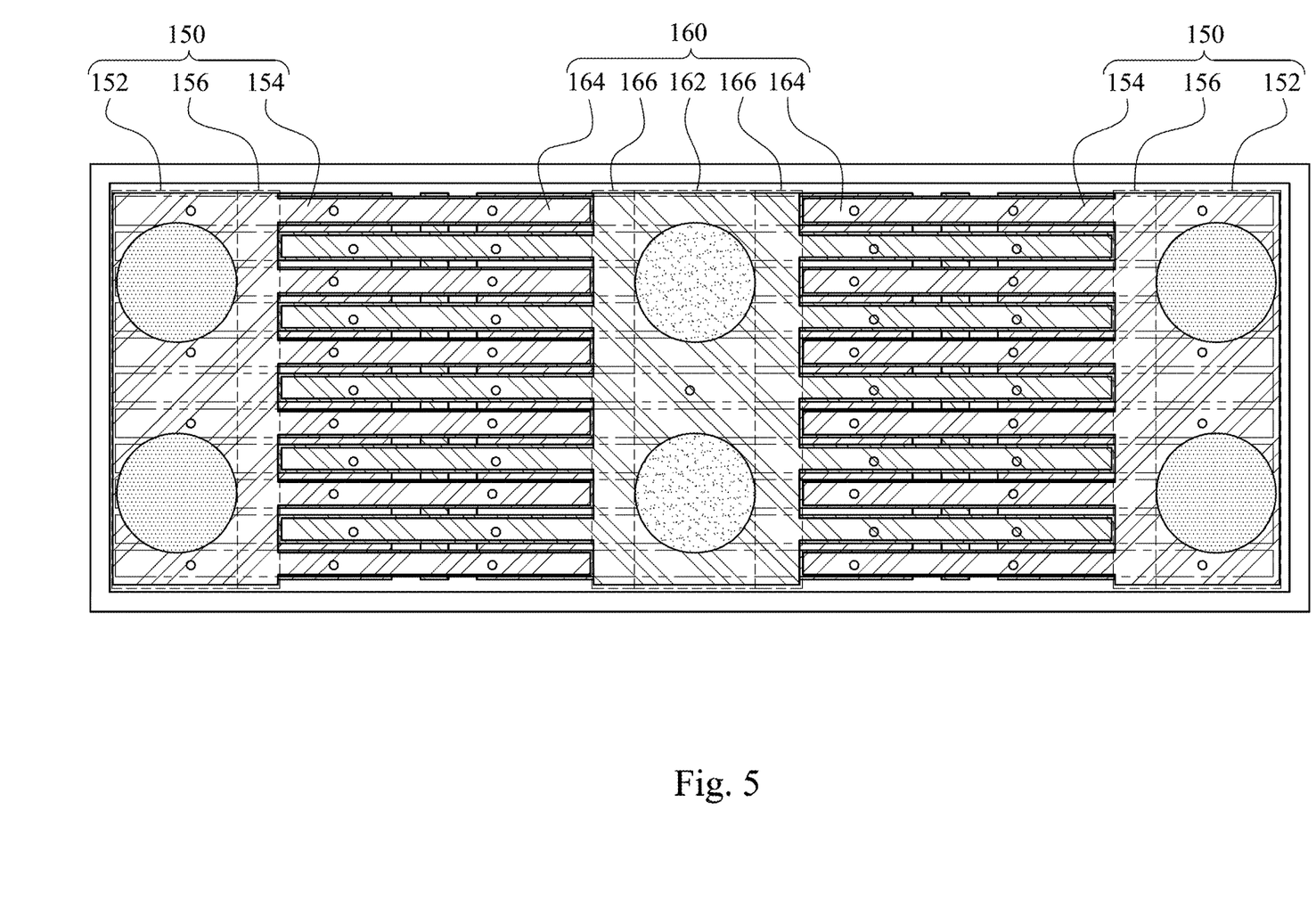
FIG. 5 is a top view of a semiconductor device according to some embodiments of the present disclosure.

FIG. 5 is a top view of a semiconductor device according to some embodiments of the present disclosure. The difference between the semiconductor devices of FIGS. 5 and 1 pertains to the configuration of the source pad(s) 150 and the drain pad 160. In FIG. 5, the semiconductor device includes two source pads 150 and one drain pad 160. The source pads 150 are substantially mirror symmetric, and the drain pad 160 is disposed between the source pads 150. The source pads 150 have similar configuration to the source pad 150 of FIG. 1. Moreover, the drain pad 160 includes one body portion 162, two current diffusion portions 166, and a plurality of branch portions 164. The current diffusion portions 166 are disposed on opposite sides of the body portion 162, and the current diffusion portion 166 is disposed between the body portion 162 and some of the branch portions 164. Other relevant structural details of the semiconductor device of FIG. 5 are similar to the semiconductor device of FIG. 1, and, therefore, a description in this regard will not be repeated hereinafter.

Furthermore, although in FIG. 5, the semiconductor device includes two source pads 150 and one drain pad 160, in some other embodiments, the semiconductor device may include one source pad 150 and two drain pads 160, or include a plurality of source pads 150 and a plurality of drain pads 160 alternatively arranged.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A semiconductor device, comprising:
   an active layer having an active region;
   a source electrode, a drain electrode, and a gate electrode disposed on the active region of the active layer;
   a source pad electrically connected to the source electrode through a via, the source pad is defined by a single piece of conductive material that is continuous throughout, and wherein the source pad comprises:
      a body portion at least partially disposed on the active region of the active layer, wherein the body portion of the source pad extends along a first direction;
      a plurality of branch portions extending along a second direction different from the first direction; and
      at least one current diffusion portion interconnecting the body portion of the source pad and the branch portions of the source pad and extending along the first direction, wherein a width of the at least one current diffusion portion of the source pad is greater than a width of one of the branch portions of the source pad and less than a half of a width of the body portion of the source pad, and the body portion, the branch portions, and the at least one current diffusion portion are integrally formed as a single piece;

a drain pad electrically connected to the drain electrode and having at least one current diffusion portion, wherein a gap is formed between the source pad and the drain pad, and an area of the gap is about 10% to about 50% of an accommodating area defined by the current diffusion portion of the source pad and the current diffusion portion of the drain pad;

at least one source external connecting element disposed on the body portion of the source pad and spaced from the current diffusion portion of the source pad; and a dielectric layer, wherein two opposite surfaces of the source pad are respectively in contact with the source external connecting element and the dielectric layer.

2. The semiconductor device of claim 1, wherein the current diffusion portion of the source pad separates the body portion of the source pad and the branch portions of the source pad.

3. The semiconductor device of claim 1, wherein the body portion of the source pad and the branch portions of the source pad are disposed on opposite sides of the current diffusion portion of the source pad.

4. The semiconductor device of claim 1, wherein an edge of the source external connecting element adjacent to the current diffusion portion of the source pad is aligned with an interface of the body portion of the source pad and the current diffusion portion of the source pad.

5. The semiconductor device of claim 1, wherein the current diffusion portion of the source pad and the body portion of the source pad have substantially the same length.

6. The semiconductor device of claim 1, wherein the source pad satisfies: $1 \leq L2/((W1+W3)/2) \leq 3$, wherein W1 is the width of the current diffusion portion of the source pad, W3 is the width of the body portion of the source pad, and L2 is a length of one of the branch portions of the source pad.

7. The semiconductor device of claim 1, wherein the body portion of the source pad overlaps at least a portion of the source electrode.

8. The semiconductor device of claim 1, further comprising at least one bottom source metal layer disposed between the source electrode and the source pad.

9. The semiconductor device of claim 8, wherein a plurality of the bottom source metal layers are spaced from each other.

10. The semiconductor device of claim 8, further comprising at least one top source metal layer disposed between the bottom source metal layer and the source pad.

11. The semiconductor device of claim 10, wherein a plurality of the top source metal layers are spaced from each other.

12. The semiconductor device of claim 10, wherein a thickness of the bottom source metal layer is smaller than a sum of a thickness of the top source metal layer and a thickness of the source pad.

13. The semiconductor device of claim 10, wherein the top source metal layer is wider than at least one of the branch portions of the source pad.

14. The semiconductor device of claim 1, wherein the drain pad comprises:

a body portion at least partially disposed on the active region of the active layer, wherein the body portion of the drain pad extends along the first direction; and a plurality of branch portions extending along the second direction, and the branch portions of the source pad and the branch portions of the drain pad are alternately arranged;

wherein the current diffusion portion of the drain pad interconnects the body portion of the drain pad and the branch portions of the drain pad and extending along the first direction.

15. The semiconductor device of claim 14, wherein a width of the current diffusion portion of the drain pad is greater than a width of one of the branch portions of the drain pad and less than a half of a width of the body portion of the drain pad.

16. The semiconductor device of claim 14, further comprising at least one bottom drain metal layer disposed between the drain electrode and the drain pad.

17. The semiconductor device of claim 16, wherein a plurality of the bottom drain metal layers are spaced from each other.

18. The semiconductor device of claim 16, further comprising at least one top drain metal layer disposed between the bottom drain metal layer and the drain pad.

19. The semiconductor device of claim 18, wherein a plurality of the top drain metal layers are spaced from each other.

20. The semiconductor device of claim 1, wherein a density of the branch portions of the source pad and the branch portions of the drain pad in the accommodating area is about 50% to about 90%.

* * * * *